(12) United States Patent
Guo et al.

(10) Patent No.: US 12,721,133 B2
(45) Date of Patent: Aug. 25, 2026

(54) CONTACT STRUCTURE AND METHOD OF FORMING THE SAME

(71) Applicant: Yangtze Memory Technologies Co., Ltd., Wuhan (CN)

(72) Inventors: Zhen Guo, Wuhan (CN); Lei Xue, Wuhan (CN); Wei Xu, Wuhan (CN); Bin Yuan, Wuhan (CN); ZongLiang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 917 days.

(21) Appl. No.: 17/887,997

(22) Filed: Aug. 15, 2022

(65) Prior Publication Data

US 2024/0055353 A1 Feb. 15, 2024

(51) Int. Cl.

| | |
|---|---|
| ***H10W 20/20*** | (2026.01) |
| ***H10B 41/27*** | (2023.01) |
| ***H10B 41/41*** | (2023.01) |
| ***H10B 43/27*** | (2023.01) |
| ***H10B 43/40*** | (2023.01) |
| ***H10W 20/41*** | (2026.01) |

(52) U.S. Cl.

CPC ............ *H10W 20/20* (2026.01); *H10B 41/27* (2023.02); *H10B 41/41* (2023.02); *H10B 43/27* (2023.02); *H10B 43/40* (2023.02); *H10W 20/435* (2026.01)

(58) Field of Classification Search

CPC .............. H10B 20/40–65; H10B 53/20; H10B 41/20–27; H10B 43/20–27; H10B 51/20; H10B 63/84–845

See application file for complete search history.

(56) References Cited

U.S. PATENT DOCUMENTS

| | | | | |
|---|---|---|---|---|
| 9,865,540 | B2 * | 1/2018 | Kim | H01L 21/76877 |
| 2019/0013237 | A1 * | 1/2019 | Nam | H10B 43/50 |
| 2019/0326166 | A1 | 10/2019 | Nam et al. | |
| 2020/0144380 | A1 * | 5/2020 | Hwang | H10B 41/10 |
| 2021/0358805 | A1 * | 11/2021 | Hopkins | H10B 43/40 |
| 2022/0278051 | A1 * | 9/2022 | Scarbrough | H10B 43/50 |

FOREIGN PATENT DOCUMENTS

TW 202213733 A 4/2022

OTHER PUBLICATIONS

Taiwanese Office Action issued on Feb. 20, 2024 in the corresponding Taiwanese Patent Application No. 111149583, 8 pages.

* cited by examiner

*Primary Examiner* — Christine S. Kim
*Assistant Examiner* — Cole Leon Lindsey
(74) *Attorney, Agent, or Firm* — Oblon, McClelland, Maier & Neustadt, L.L.P.

(57) ABSTRACT

Aspects of the disclosure provide a semiconductor device. The semiconductor device includes a memory stack of gate layers and insulating layers, a landing structure and a contact structure. The gate layers and the insulating layers are stacked alternatingly, and form stair steps in a staircase region. The landing structure is disposed on a first gate layer of a first stair step of the stair steps in the staircase region. The landing structure includes an upper structure and an isolation stack between the upper structure and the first gate layer. The upper structure is etch-selective to a contact isolation layer that covers the staircase region. The contact structure extends through the contact isolation layer and the landing structure and is connected with the first gate layer of the first stair step.

18 Claims, 8 Drawing Sheets

CONTACT STRUCTURE AND METHOD OF FORMING THE SAME

TECHNICAL FIELD

The present application describes embodiments generally related to semiconductor memory devices, and methods for forming the semiconductor memory devices.

BACKGROUND

Semiconductor manufacturers have developed vertical device technologies, such as three dimensional (3D) NAND flash memory technology and the like, to achieve higher data storage density without requiring smaller memory cells. In some examples, a 3D NAND memory device includes a core region (also known as an array region) and a staircase region. The core region includes an array of channel structures extending through a stack of gate layers and insulating layers. The gate layers and the channel structures can form vertical NAND memory cell strings. The staircase region is used to form connections to control the vertical NAND memory cell strings.

SUMMARY

Aspects of the disclosure provide a semiconductor device and a method of forming the same.

According to a first aspect, a semiconductor device is provided. The semiconductor device includes a memory stack of gate layers and insulating layers, a first landing structure and a first contact structure. The gate layers and the insulating layers are stacked alternatingly and form stair steps in a staircase region. The first landing structure is disposed on a first gate layer of a first stair step of the stair steps in the staircase region. The first landing structure includes a first upper structure and a first isolation stack between the first upper structure and the first gate layer. The first upper structure is etch-selective to a contact isolation layer that covers the staircase region. The first contact structure extends through the contact isolation layer and the first landing structure and is connected with the first gate layer of the first stair step.

In some embodiments, the first upper structure includes a same conductive material as the first gate layer.

In some embodiments, a second landing structure is disposed on a second gate layer of a second stair step of the stair steps in the staircase region. The second landing structure includes a second upper structure of the conductive material and a second isolation stack between the second upper structure and the second gate layer. A second contact structure extends through the contact isolation layer and the second landing structure and is connected with the second gate layer of the second stair step. The first upper structure and the second upper structure are isolated by the contact isolation layer.

In some embodiments, the first isolation stack and the second isolation stack share a stair step isolation layer that extends over the stair steps.

In some embodiments, the stair step isolation layer covers the stair steps in a conformal manner.

In some embodiments, the stair step isolation layer includes a dielectric material that is etch-selective to silicon nitride.

In some embodiments, the first isolation stack further includes one of the insulating layers stacked on the first gate layer.

In some embodiments, the first upper structure includes a recessed sidewall profile.

In some embodiments, the first contact structure includes a protruding portion into the first upper structure.

In some embodiments, the first upper structure includes a first etch stop structure.

According to a second aspect of the disclosure, a memory system device includes a semiconductor memory device and a control circuitry coupled with the semiconductor memory device to control data storage operations on the semiconductor memory device. The semiconductor memory device includes a memory stack of gate layers and insulating layers, a landing structure, a contact structure and a channel structure. The gate layers and the insulating layers are stacked alternatingly and form stair steps in a staircase region. The landing structure is disposed on a first gate layer of a first stair step of the stair steps in the staircase region. The landing structure includes an etch stop structure and an isolation stack between the etch stop structure and the first gate layer. The etch stop structure is etch-selective to a contact isolation layer that covers the staircase region. The contact structure extends through the contact isolation layer and the landing structure and is connected with the first gate layer of the first stair step. The channel structure extends through the memory stack of gate layers and insulating layers in an array region.

According to a third aspect of the disclosure, a method for fabricating a semiconductor device includes forming stair steps in a staircase region of a memory stack of gate layers and insulating layers. The gate layers and the insulating layers are stacked alternatingly. A landing structure is formed on a first gate layer of a first stair step of the stair steps in the staircase region. The landing structure includes an etch stop structure and an isolation stack between the etch stop structure and the first gate layer. The etch stop structure is etch-selective to a contact isolation layer that covers the staircase region. A contact structure is formed that extends through the contact isolation layer and the landing structure. The contact structure is connected with the first gate layer of the first stair step.

In some embodiments, the forming the landing structure further includes forming the etch stop structure with a same conductive material as the gate layers.

In some embodiments, the forming the etch stop structure further includes replacing a sacrificial etch stop structure corresponding to the etch stop structure and sacrificial gate layers corresponding to the gate layers with the same conductive material in a same replacement process.

In some embodiments, the forming the etch stop structure further includes depositing a stair step isolation layer over the stair steps. A topside sacrificial layer is deposited over the stair step isolation layer. The topside sacrificial layer is patterned into the sacrificial etch stop structure.

In some embodiments, the patterning the topside sacrificial layer further includes removing transitional portions of the topside sacrificial layer above risers of the stair steps.

In some embodiments, the patterning the topside sacrificial layer further includes depositing a hard mask layer. Portions of the hard mask layer are disposed on the transitional portions of the topside sacrificial layer above the risers of the stair steps. The portions of the hard mask layer on the transitional portions of the topside sacrificial layer are removed. The transitional portions of the top sacrificial layer are removed.

In some embodiments, the removing the portions of the hard mask layer on the transitional portions of the topside sacrificial layer further includes curing the hard mask layer so that the portions of the hard mask layer on the transitional portions of the topside sacrificial layer are less etch-resistant than other portions of the hard mask layer.

In some embodiments, the forming the memory stack includes forming an initial memory stack of the sacrificial gate layers and the insulating layers. The sacrificial gate layers and the insulating layers are stacked alternatingly and form the stair steps in the staircase region. The sacrificial gate layers are replaced with the gate layers to form the memory stack of the gate layers and the insulating layers.

In some embodiments, the forming the contact structure includes etching an initial contact hole through the contact isolation layer with a stop based on the etch stop structure. The landing structure is etched through based on the initial contact hole to form a contact hole that exposes the first gate layer. The contact structure is formed in the contact hole.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
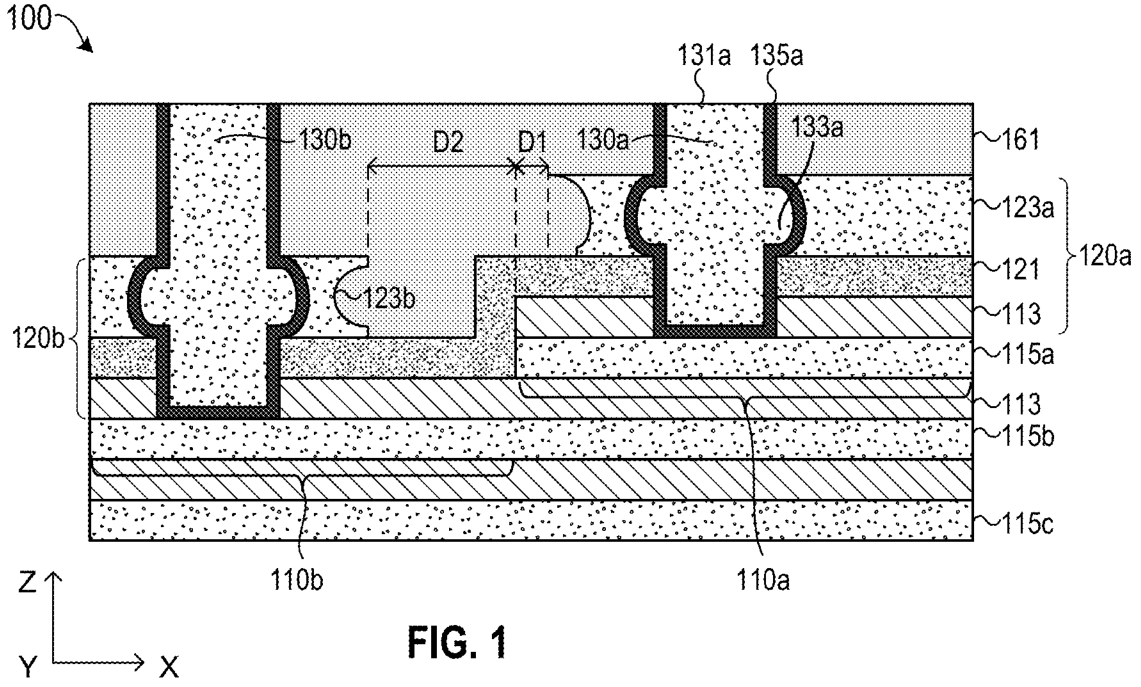
FIG. 1 shows a vertical cross-sectional view of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some aspects of the disclosure, a three dimensional (3D) NAND flash memory device includes vertical memory cell strings formed in a memory stack of gate layers and insulting layers. The gate layers and the insulating layers are stacked alternatingly. The gate layers can correspond to gate terminals of transistors in the vertical memory strings. The 3D NAND flash memory device can include a staircase region to facilitate connections to the gate layers. The staircase region includes stair steps, and each gate layer can be a top gate layer in a stair step. In some examples, contact holes are etched through a contact isolation layer to expose respective top gate layers on respective stair steps in the staircase region. Then, contact structures can be formed in the contact holes to connect respective top gate layers on the stair steps to, for example word lines of the 3D NANAD flash memory device.

To prevent the etch process for forming the contact holes from punching through (e.g. etching through) the top gate layers, the top gate layers of the stair steps can be thickened. The thickness increase of the top gate layers in the staircase region can be performed by a topside sacrificial layer technique in a gate last technology. In the gate last technology, an initial memory stack of sacrificial layers and insulating layers are formed, and the sacrificial layers and the insulating layers are stacked alternatingly in the initial memory stack. After channel structures are formed in the initial memory stack in an array region and stair steps are formed based on the initial memory stack in the staircase region, the sacrificial layers can be replaced with gate layers to form the memory stack. In some examples, the sacrificial layers are made of silicon nitride, and the insulating layers are made of silicon dioxide.

Using the topside sacrificial layer technique, after the formation of the stair steps in the staircase region, the sacrificial layers can be exposed on the stair steps. Then, a topside sacrificial layer (e.g., an additional silicon nitride layer) can be formed over the stair steps. The topside sacrificial layer can increase the thickness of the sacrificial layers on the stair steps. The topside sacrificial layer can be patterned to form landing pads respectively on the stair steps, and the landing pads are isolated from each other. In the process that replaces the sacrificial layer with the gate layers, the landing pads can be replaced by material that forms the gate layers.

In some related examples, the patterning of the topside sacrificial layer relies on a sidewall profile in the staircase region to ensure isolation of the landing pads. In a related example, a thicker top sacrificial layer can cause a gentle slope over a stair riser portion compared to a thinner top sacrificial layer that can cause a steep slope over a stair riser. The gentle slope may lead to residues of the topside sacrificial layer between adjacent stair steps during the patterning process. When the residues are replaced by the material of the gate layers, the residues can cause leakage or even shorts between word lines. In another related example, a staircase region may include a sidewall of the memory stack. When the profile of the sidewall is not steep enough, for example, a portion of the sidewall having a sub shoulder, the patterning process may leave residues at the sub shoulder. When the residues are replaced by the material of the gate layers, the residues can cause leakage or even shorts between word lines.

The present disclosure provides techniques to use a specific isolation film (also referred to as a stair step isolation layer) to isolate the sacrificial layers in the stair steps from the topside sacrificial layer, and the stair step isolation layer can also assist the forming of the contact holes without punching through the top gate layers. Techniques herein include forming respective landing structures over the top gate layers of respective stair steps. A landing structure includes an etch stop structure and an isolation stack, and the isolation stack is arranged between the etch stop structure and the top gate layer of the stair step. The isolation stack includes the stair step isolation layer that spreads over the stair steps after the formation of the stair steps in the staircase region. The etch stop structure is formed of a material that is etch-selective to the contact isolation layer (e.g., a ratio of an etch rate of the material in the etch stop structure to an etch rate of the contact isolation layer is over 10). It is noted that contact holes for the contact structures on the respective stair steps in the staircase region may have different depths in the contact isolation layer. The contact hole etch process can include two sub-etch steps. The etch stop structure can be suitably configured, such that the first sub-etch step can etch through the contact isolation layer on the respective stair steps and stop at or within the etch stop structures on the respective stair steps without etching through the landing structures. The second sub-etch step can etch through the etch stop structure and the isolation stack, thus the contact holes can expose respective top gate layers of the respect stair steps. After that, contact structures can be formed in the contact holes. In some examples, the etch stop structures and the gate layers are formed in a same replacing process and thus include a same material.

According to some aspects of the disclosure, the stair step isolation layer is deposited by atomic layer deposition (ALD). Thus, the stair step isolation layer can conformally or semi-conformally cover sidewalls (e.g., risers) of the stair steps. The stair step isolation layer can separate the aforementioned residues, if there are any, from the gate layers and avoid current leakage between the gate layers. As a result, the thickness of the topside sacrificial layer can be increased, which enlarges an operation window for contact hole formation.

FIG. 1 shows a vertical cross-sectional view of a semiconductor device 100, in accordance with exemplary embodiments of the present disclosure. The semiconductor device 100 includes a memory stack of gate layers 115 (for example shown by 115*a*, 115*b* and 115*c*) and insulating layers 113. The gate layers 115 and the insulating layers 113 are stacked alternatingly, and form stair steps 110 (e.g. 110*a* and 110*b*) in a staircase region. The stair steps are covered by a contact isolation layer 161 in the staircase region, and contact structures 130 (e.g., 130*a* and 130*b*) are formed in the contact isolation layer 161 and are connected with the respective gate layers 115.

In the FIG. 1 example, the gate layer 115*a* is the top gate layer of the stair step 110*a*, and the gate layer 115*b* is the top gate layer of the stair step 110*b*. In the following description, the stair step 110*a* is referred to as a first stair step 110*a*, the stair step 110*b* is referred to as a second stair step 110*b*, the gate layer 115*a* is referred to as a first gate layer 115*a*, and the gate layer 115*b* is referred to as a second gate layer 115*b*.

The semiconductor device 100 includes landing structures respectively on the stair steps. Specifically, in the FIG. 1 example, the semiconductor device 100 includes a first landing structure 120*a* on the first stair step 110*a*, and includes a second landing structure 120*b* on the second stair step 110*b*. For example, the first landing structure 120*a* is positioned on the first stair step 110*a*, and between the contact isolation layer 161 and the first gate layer 115*a* of the first stair step 110*a*. The first landing structure 120*a* includes a first upper structure (such as a first etch stop structure 123*a*) and a first isolation stack between the first etch stop structure 123*a* and the first gate layer 115*a*. The first etch stop structure 123*a* is configured to be etch-selective to the contact isolation layer 161. The first isolation stack includes a stair step isolation layer 121 (also referred to as an isolation film 121) and another isolation layer that is one of the insulating layers 113. Similarly, the second landing structure 120*b* includes a second upper structure (such as a second etch stop structure 123*b*) and a second isolation stack that includes the stair step isolation layer 121 and one of the insulating layers 113.

As shown in FIG. 1, the first etch stop structure 123*a* and the second etch stop structure 123*b* are spaced apart from each other and are electrically insulated by the contact isolation layer 161. Specifically, the first etch stop structure 123*a* can have a smaller dimension than the first gate layer 115*a* in a direction (e.g. the X direction) parallel to the main surface of the memory stack. As a result, the first etch stop structure 123*a* is offset from adjacent stair steps in the X direction. For example, the first etch stop structure 123*a* is positioned directly above the first stair step 110*a* and has a horizontal offset D1 from the second stair step 110*b*. Similarly, the second etch stop structure 123*b* is positioned directly above the second stair step 110*b* and has a horizontal offset D2 from the first stair step 110*a*. In other words, the first etch stop structure 123*a* and the second etch stop structure 123*b* are both spaced apart from a boundary (or a riser) between the first stair step 110*a* and the second stair step 110*b*. The first and second etch stop structures 123*a* and 123*b* have a horizontal offset D1+D2 from each other. Note that the first and second etch stop structures 123*a* and 123*b* can have irregular ends, such as recessed shapes or undercuts in the example of FIG. 1.

In some embodiments, the etch stop structures (e.g. 123*a* and 123*b*) and the gate layers (e.g. 115*a* and 115*b*) can be formed of a same conductive material, such as tungsten. In some embodiments, the stair step isolation layer 121 can extend over the stair steps and cover the stair steps in a conformal manner. The stair step isolation layer 121 can include a dielectric material that is etch-selective to silicon nitride, such as silicon oxide.

The semiconductor device 100 can also include contact structures (e.g. 130*a* and 130*b*) respectively connected to the gate layers of the stair steps. Specifically in the example of FIG. 1, the semiconductor device 100 includes a first contact structure 130*a* which extends through the contact isolation layer 161 and the first landing structure 120*a*, and is connected to the first gate layer 115*a*. Similarly, a second contact structure 130*b* extends through the contact isolation layer 161 and the second landing structure 120*b*, and is connected to the second gate layer 115*b*.

In the FIG. 1 example, the contact structures 130 can include protruding portions, such as a protruding portion 133*a* in the first contact structure 130*a*, that protrude into respective etch stop structures in a direction parallel to the main surface of the memory stack. For instance, the first contact structure 130*a* protrudes into the first etch stop structure 123*a* in a horizontal direction in the XY plane. That is, the first contact structure 130*a* includes a vertical portion 131*a* and the protruding portion 133*a* which surrounds part of the vertical portion 131*a*. The vertical portion 131*a* extends vertically through the first etch stop structure 123*a* while the protruding portion 133*a* extends horizontally into the first etch stop structure 123*a*. In some examples, the contact structures 130 include a glue layer, such as a glue layer 135*a* for the first contact structure 130*a*. The glue layer 135*a* can be disposed before a deposition of a main portion of the first contact structure 130*a*, and is between the main portion of the first contact structure 130*a* and other structures. For example, the glue layer 135*a* forms a sidewall surface and a bottom surface of the first contact structure 130*a*. The glue layer 135*a* is made of conductive material(s) (e.g., titanium (Ti) and titanium nitride (TiN)) so that the first contact structure 130*a* is electrically connected to the first gate layer 115*a*. In some embodiments, the contact structures (e.g. 130*a*) and the etch stop structures (e.g. 123*a*) include a same conductive material, such as tungsten. In the FIG. 1 example, the glue layer 135*a* is between the tungsten portion of the first etch stop structure 123*a* and the tungsten portion of the first contact structure 130*a*.

While not shown, the semiconductor device 100 can further include a plurality of channel structures that are formed in the memory stack of gate layers 115 and insulating layers 113 in an array region. The channel structures and the memory stack can form transistors that are stacked vertically. In some examples, a stack of transistors includes memory cells and select transistors, such as one or more bottom select transistors, one or more top select transistors and the like. The gate layers 115 can correspond to the gate terminals of the transistors and can be connected to word line (WL) driving circuits by the contact structures 130 and other suitable connection structures (not shown), such as routing wires, via connections and the like.

Note that the staircase region can be positioned in the middle of the memory stack, on a boundary of the memory stack or in any other position of the memory stack. Each stair step can include one or more pairs of the gate layers 115 and the insulating layer 113. In the FIG. 1 example, the stair step isolation layer 121 is disposed on an insulating layer 113 above the first gate layer 115*a* in the first stair step 110*a*. Accordingly, the first isolation stack can include the insulating layer 113 and the stair step isolation layer 121. In another example (not shown), the stair step isolation layer 121 is disposed on the first gate layer 115*a*. Accordingly, the first isolation stack may include the stair step isolation layer 121 only.

It is noted that the semiconductor device 100 can be any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like. It is also noted that, the semiconductor device 100 can include other suitable circuitry (not shown), such as logic circuitry, power circuitry, and the like that is formed on a same substrate, or other suitable substrate, and is suitably coupled with a memory portion. Generally, the memory portion includes the aforementioned memory cells and peripheral circuitry (e.g., address decoder, driving circuits, sense amplifier and the like).

Further, in one embodiment, the semiconductor device 100 includes a substrate (not shown). The memory stack of gate layers 115 and insulating layer 113 can be formed on the substrate. In another embodiment, the substrate can be removed from the final semiconductor device 100 by backside processing.

Figure 2:
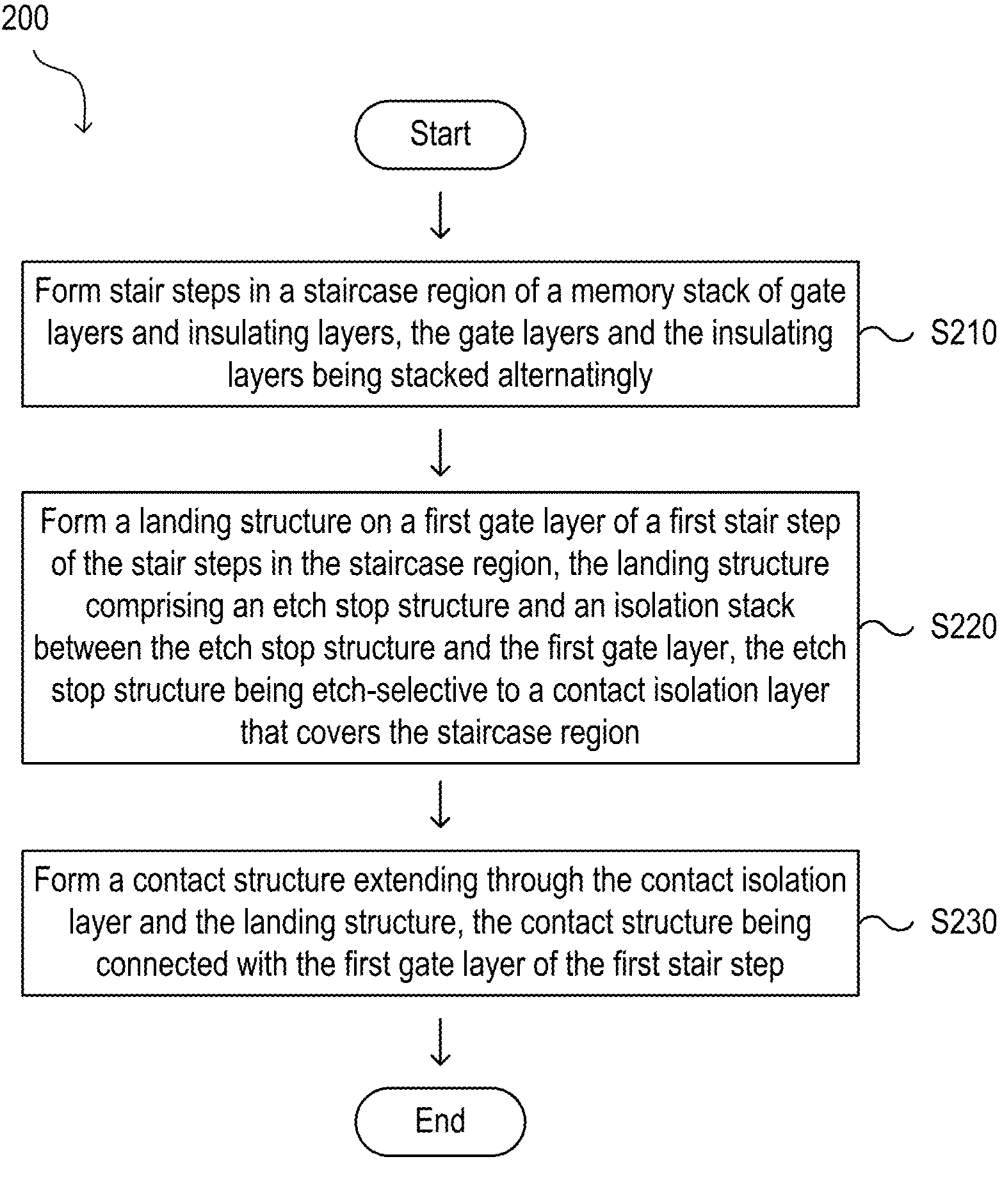
FIG. 2 shows a flow chart of a process for manufacturing a semiconductor device, in accordance with exemplary embodiments of the disclosure.

FIG. 2 shows a flow chart of a process 200 for manufacturing a semiconductor device, such as the semiconductor device 100, in accordance with exemplary embodiments of the disclosure.

At S210, a memory stack of gate layers and insulating layers is formed. The gate layers and the insulating layers are stacked alternatingly and form stair steps in a staircase region. In some embodiments, an initial memory stack of sacrificial gate layers and the insulating layers is formed. The sacrificial gate layers respectively correspond to the gate layers. The sacrificial gate layers and the insulating layers are stacked alternatingly, and form the stair steps in the staircase region. The sacrificial gate layers can be replaced with the gate layers in a later process to form the memory stack of gate layers and insulating layers.

At S220, landing structures are formed respectively on the top gate layers of the stair steps. For example, the first landing structure 120*a* is formed on the first gate layer 115*a* of the first stair step 110*a* in the staircase region. In some examples, each landing structure of a stair step can include an etch stop structure and an isolation stack between the etch stop structure and the top gate layer of the stair step. The etch stop structures are etch-selective to a contact isolation layer that covers the stair steps in the staircase region. In some embodiments, the etch stop structures and the gate layers include a same material and may be formed in a same replacement process.

In some embodiments, a gate last technology is used and the etch stop structures are formed based on a topside sacrificial layer. In some examples, the topside sacrificial layer is formed over the isolation stack. The topside sacrificial layer covers risers of the stair steps. The topside sacrificial layer can be patterned to form sacrificial etch stop structures respectively of the stair steps. For examples, portions of the topside sacrificial layer above the risers (also referred to as transitional portions of the topside sacrificial layer between stair steps) are removed so that remaining portions of the topside sacrificial layer on the stair steps are separate from each other, and form sacrificial etch stop structures correspond to the etch stop structures. In an example, the sacrificial etch stop structures can be replaced by gate material at the same time of replacing the sacrificial gate layers with the gate layers using a same replacement process.

In some embodiments, to pattern the topside sacrificial layer, a hard mask layer, such as a carbon based mask layer, is formed over the topside sacrificial layer. The hard mask layer includes slopes over the transitional portions of the topside sacrificial layer around the risers. The hard mask layer is then directionally cured so that the slopes are less etch-resistant than other portions of the hard mask layer. Next, openings are formed through the slopes by etching the hard mask layer. The transitional portions of the topside sacrificial layer around the risers are subsequently removed via the openings.

In some embodiments, a wet etch process can be used to remove the transitional portions of the topside sacrificial layer, and a stair step isolation layer is used to facilitate the use of the wet etch process. In some examples, the stair step isolation layer is formed over the stair steps. In some examples, the stair step isolation layer is configured to have good step coverage, and thus the stair step isolation layer can be formed to cover the stair steps in a conformal manner. For example, the stair step isolation layer can be formed by atomic layer deposition. Further, the stair step isolation layer is preferred to be etch-resistant during the wet etch process. In an example, the topside sacrificial layer is made of silicon nitride, the stair step isolation layer is made of silicon oxide, and the wet etch process can be suitably configured such that the stair step isolation layer is etch resistant during the wet etch process.

At S230, contact structures are formed that extend through the contact isolation layer and the landing structures and are connected with the top gate layers of the respective stair steps. In some embodiments, a multi-step contact hole etch process, such as a 3-step contact hole etch process is used. In a first step of the 3-step contact hole etch process, initial contact holes are etched into the contact isolation layer with a stop based on the etch stop structures in the landing structures. In a second step of the 3-step contact hole etch process, based on the initial contact holes, the etch stop structures are etched through. In a third step of the 3-step contact hole etch process, the landing structures are etched through with a stop on the respective top gate layers of the respective stair steps. Then, conductive material(s), such as titanium (Ti), titanium nitride (TiN), tungsten, and the like can be filled into the contact holes to form the contact structures.

It is noted that the process 200 can be suitably adapted. Step(s) in the process 200 can be modified and/or omitted. Additional step(s) can be added. Any suitable order of implementation can be used.

FIGS. 3A-3J show cross-sectional views of a semiconductor device 300 at various intermediate steps of manufacturing, in accordance with exemplary embodiments of the disclosure. In some embodiments, the semiconductor device 300 can eventually become the semiconductor device 100.

Figure 3A:
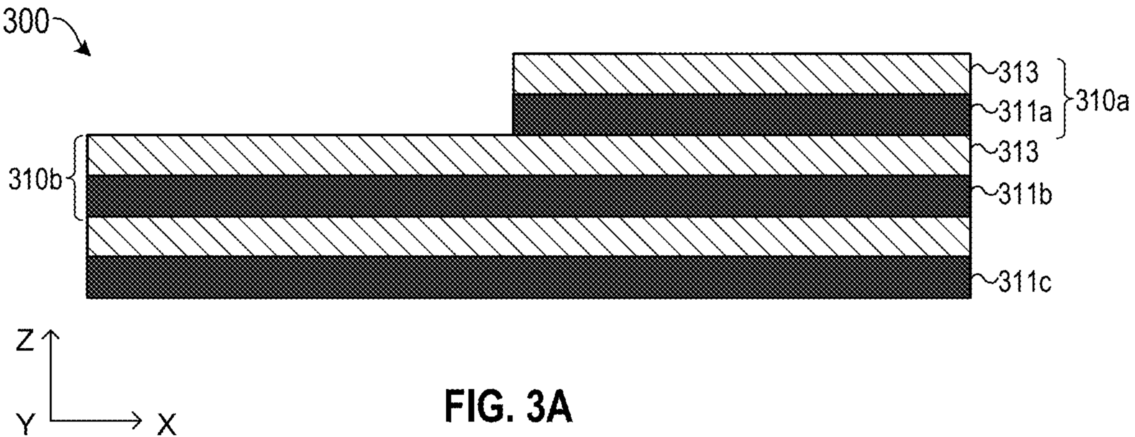
FIGS. 3A-3J show cross-sectional views of a semiconductor device at various intermediate steps of manufacturing, in accordance with exemplary embodiments of the disclosure.

As shown in FIG. 3A, an initial memory stack of sacrificial gate layers 311 (for example shown by 311*a*, 311*b* and 311*c*) and insulating layers 313 is formed on a substrate (not shown). The sacrificial gate layers 311 and the insulating layers 313 are stacked alternatingly. In some examples, channel structures (not shown) are formed in the initial memory stack in an array region, and stair steps (e.g. 310*a* and 310*b* in FIG. 3A) are formed in the initial memory stack in a staircase region. The stair steps each include one or more pairs of the sacrificial gate layers 311 and the insulating layers 313. For example, a first stair step 310*a* include a first sacrificial gate layers 311*a* and one of the insulating layers 313. A second stair step 310*b* includes a second sacrificial gate layer 311*b* and one of the insulating layers 313. In the FIG. 1 example, the insulating layer 313 is positioned over a respective sacrificial gate layer in a respective stair step. In some embodiments, the sacrificial gate layers 311 include silicon nitride, and the insulating layers 313 include silicon oxide.

Note that the insulating layers 313 herein correspond to the insulating layers 113 in FIG. 1. The sacrificial gate layers 311 will eventually be replaced with gate layers, which correspond to the gate layers 115, to form a memory stack of gate layers and insulating layers 313. It should be understood that only two stair steps are shown herein for illustrative purposes and that the semiconductor device 300 can include any number of stair steps.

Figure 3B:
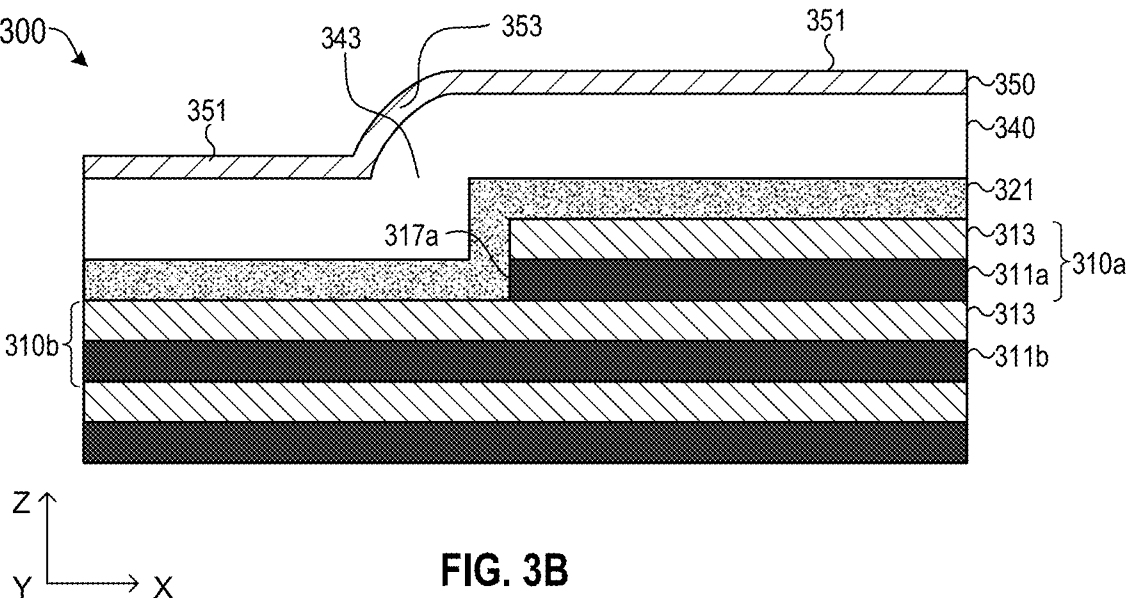

In FIG. 3B, an isolation stack is formed over the stair steps before a topside sacrificial layer 340 is formed over the isolation stack. After that, a hard mask layer 350 is formed over the topside sacrificial layer 340. As shown, a stair step isolation layer 321 of the isolation stack can be formed over the stair steps in a conformal manner. The stair step isolation layer 321 is configured to be etch-selective to the topside sacrificial layer 340. Note that the stair step isolation layer 321 herein corresponds to the stair step isolation layer 121 in FIG. 1. The topside sacrificial layer 340 will be used to form etch stop structures which correspond to the etch stop structures (e.g. 123*a* and 123*b*) in FIG. 1.

In some embodiments, the topside sacrificial layer 340 and the sacrificial gate layers 311 include a same material such as silicon nitride so that the topside sacrificial layer 340 and the sacrificial gate layers 311 can be replaced in a same future replacement process. The stair step isolation layer 321 can therefore include a dielectric material such as silicon oxide and be formed by atomic layer deposition (ALD) to achieve good coverage over the stair steps, particularly around boundaries between adjacent stair steps or risers (e.g. 317*a*) of the stair steps.

As illustrated in FIG. 3B, the topside sacrificial layer 340 includes a first slope 343 (also referred to as a transitional portion) around a riser 317*a* of the first stair step 310*a* (or a boundary between the first stair step 310*a* and the second stair step 310*b*). As a result, the hard mask layer 350 layer includes a second slope 353 formed over the first slope 343, in addition to horizontal portions 351. The hard mask layer 350 can, for example, include amorphous carbon and be formed by chemical vapor deposition. As a result, the hard mask layer 350 can cover the topside sacrificial layer 340 in a conformal or semi-conformal manner.

Figure 3C:
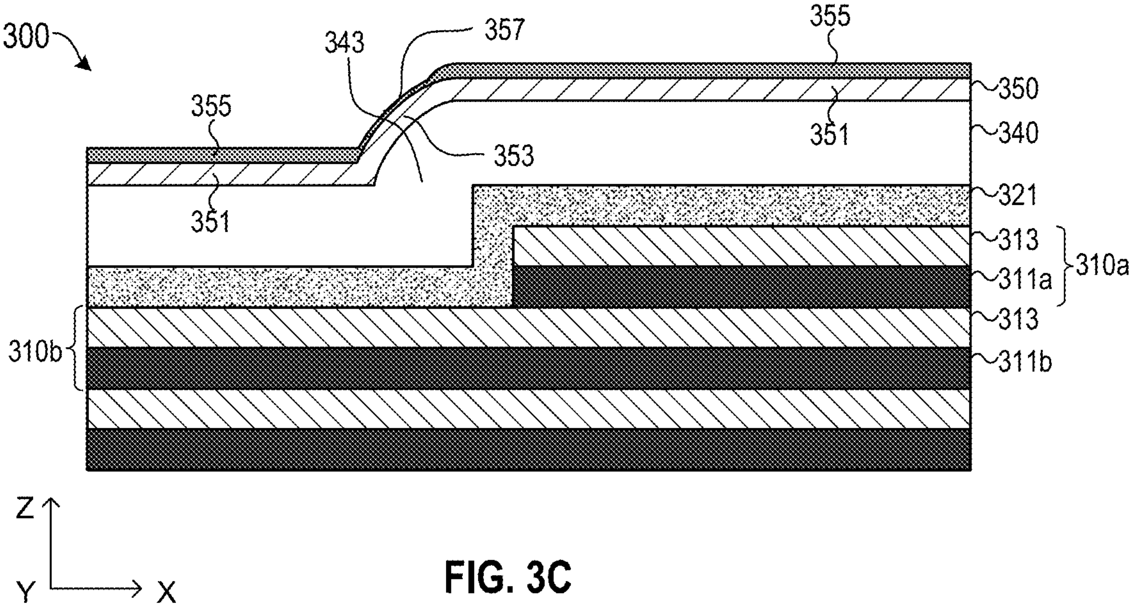

In FIG. 3C, the hard mask layer 350 is directionally cured so that the second slope 353 is less etch-resistant than the horizontal portions 351. Particularly, a plasma bombardment treatment can be executed in the Z direction to harden top layers (e.g. 355 and 357) of the hard mask layer 350, for example by forming high-density carbon. Because plasma bombardment per area is almost constant in the XY plane, cured horizontal top layers 355 are thicker than a cured slope top 357 and thus are more etch-resistant than the cured slope top 357.

Figure 3D:
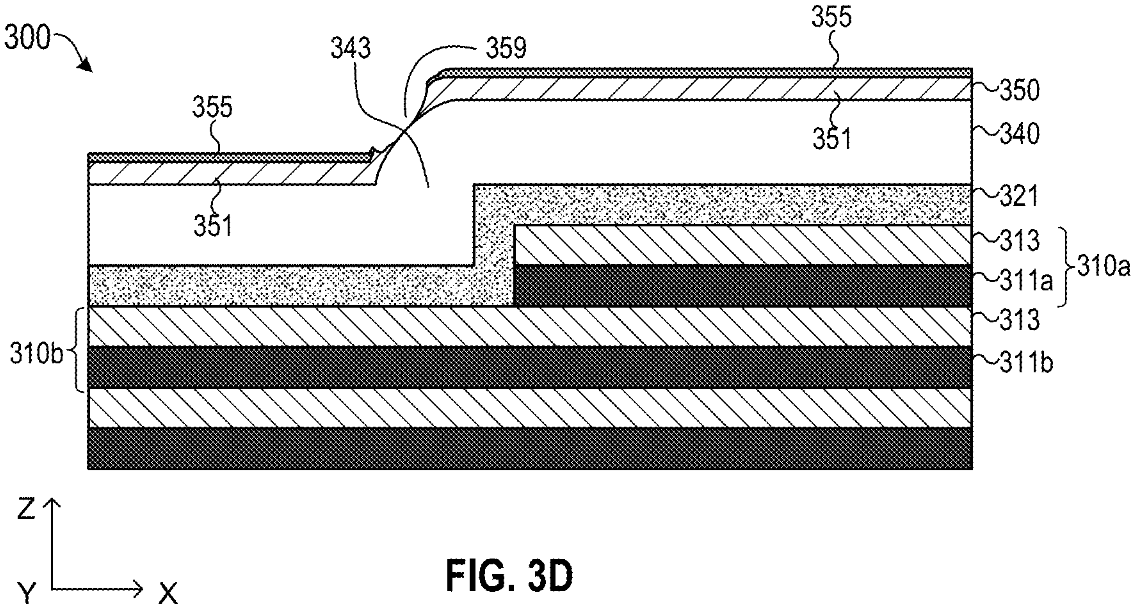

In FIG. 3D, an opening 359 is formed through the second slope 353 by etching the hard mask layer 350. This can be accomplished by an isotropic etching process for example. Because the cured horizontal top layers 355 are thicker than the cured slope top 357, the opening 359 can be formed by etching through the cured slope top 357 without removing the cured horizontal top layers 355 completely. A size of the opening 359 can be controlled by etching conditions and etching duration. The second slope 353 may be partially or wholly removed, and the first slope 343 is exposed as a result.

Figure 3E:
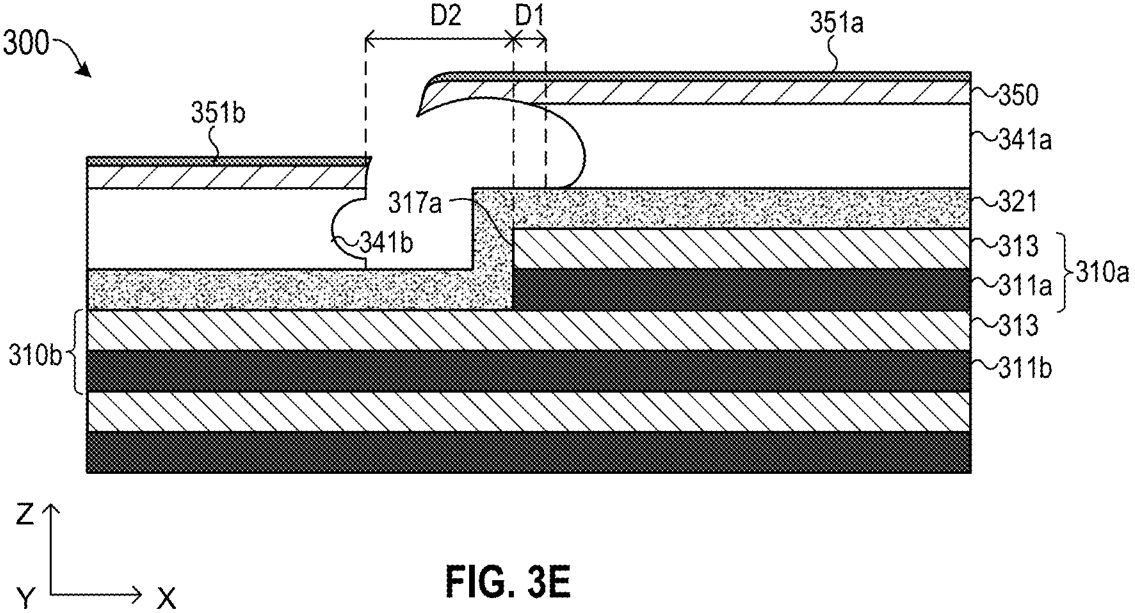

In FIG. 3E, a portion of the topside sacrificial layer 340 around the riser 317*a* of the first stair step 310*a* is removed via the opening 359, for example by a wet etch process. As a result, remaining portions (e.g. 341*a* and 341*b*) of the topside sacrificial layer 340, which are also referred to as sacrificial etch stop structures, are separate or spaced apart from each other. It should be noted that the remaining portions (e.g. 341*a* and 341*b*) of the topside sacrificial layer 340 will be replaced with etch stop structures which correspond to the etch stop structures (e.g. 123*a* an 123*b*) in FIG. 1.

In some embodiments, in order to leave no residue of the topside sacrificial layer 340 around the riser 317*a*, the wet etch process can be executed for a longer duration than needed to remove the first slope 343 only. Consequently, the wet etch process can form undercuts (or recesses) in the topside sacrificial layer 340 below the hard mask layer 350. Note that the stair step isolation layer 321 is etch-selective to the topside sacrificial layer 340 in the wet etch process so that the wet etch process does not etch the stair step isolation layer 321 significantly. For example, a ratio of an etch rate of the topside sacrificial layer 340 to an etch rate of the stair step isolation layer 321 is over 10 or even higher. Therefore, the stair step isolation layer 321 can function to protect the stair steps from the wet etch process. The wet etch process can thus be executed for a longer duration without causing problems, unlike in related examples where the longer duration may lead to etching of the sacrificial gate layers 311.

Moreover, the remaining portions of the topside sacrificial layer 340 are offset horizontally from adjacent stair steps and spaced apart from each other. For example, the remaining portion 341*a* has a horizontal offset D1' from the second stair step 310*b* while the remaining portion 341*b* has a horizontal offset D2' from the first stair step 310*a*. The remaining portions 341*a* and 341*b* are spaced apart from each other by a horizontal distance of D1'+D2'.

Figure 3F:
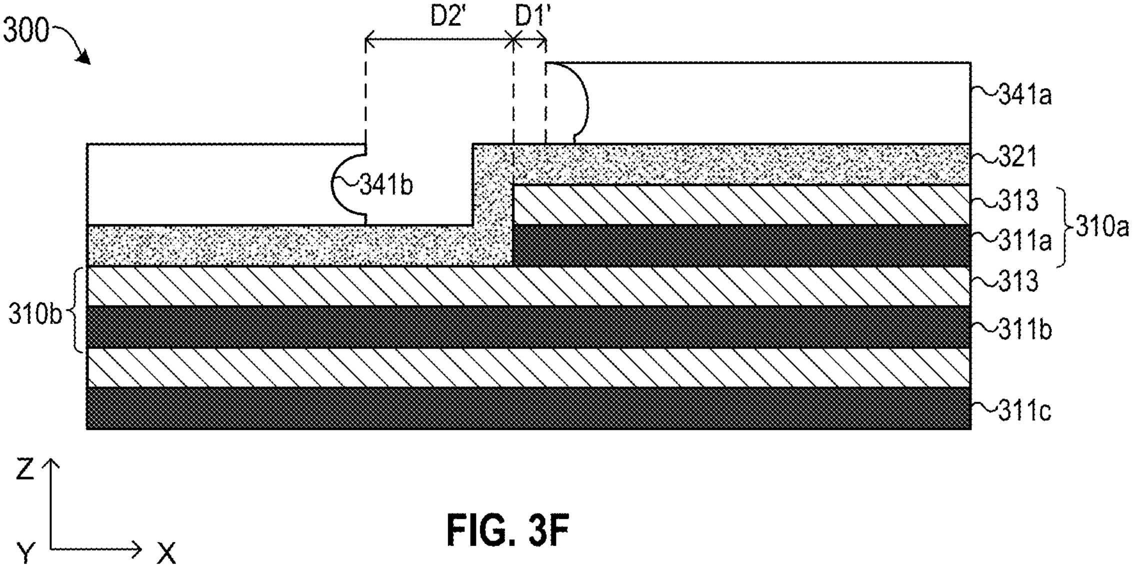

In FIG. 3F, remaining portions of the hard mask layer 350 are removed, for example by a plasma ashing process. The plasma ashing process may involve oxygen and thus cause unwanted oxidization. Therefore, another wet etch process may be executed to remove mask or polymer residues.

Figure 3G:
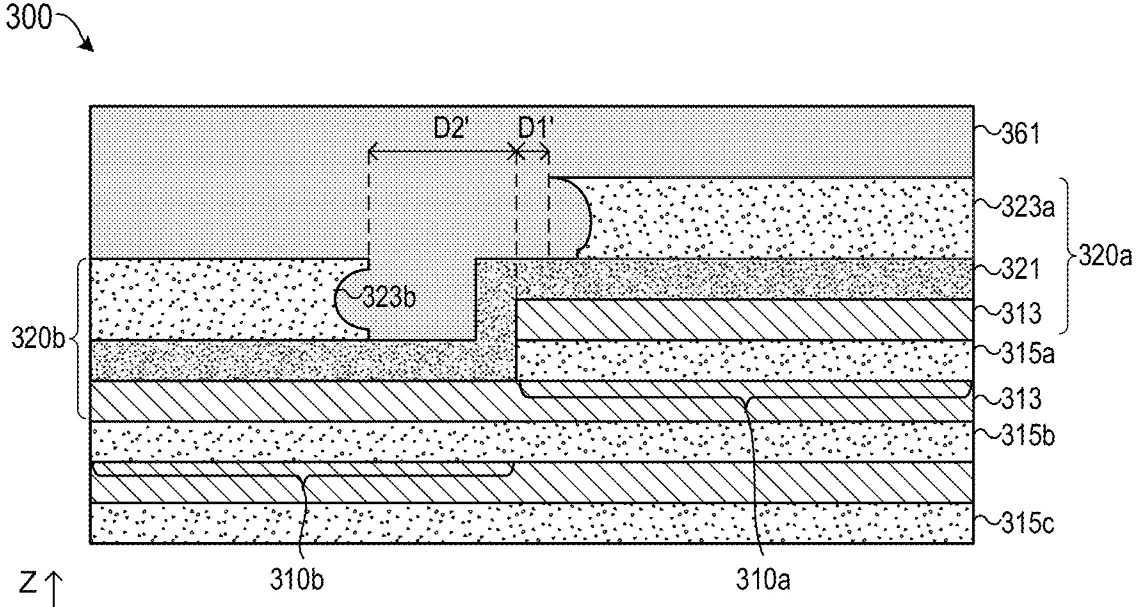
Figure 3H:
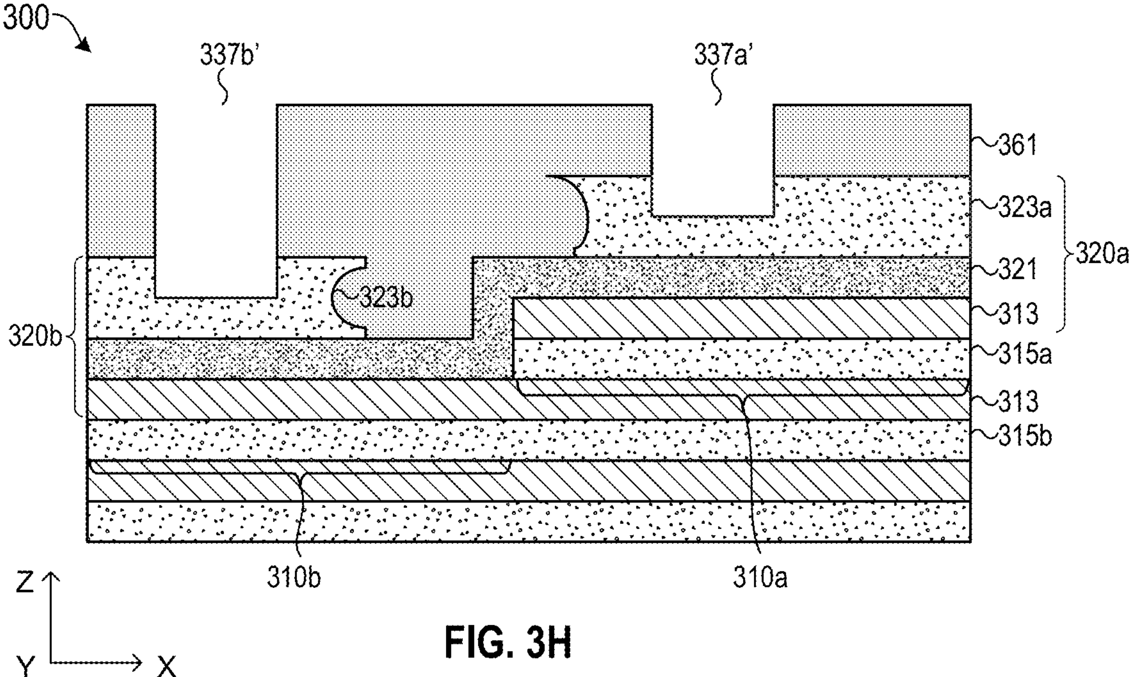

In FIG. 3G, a contact isolation layer 361 is deposited and covers the stair steps in the staircase region; the remaining portions of the topside sacrificial layer 340 are replaced with etch stop structures (e.g. 323*a* and 323*b*); and the sacrificial gate layers 311 are replaced with gate layers 315 (for example shown by 315*a*, 315*b* and 315*c*). In FIG. 3G, landing structures (e.g. 320*a* and 320*b*) are formed. Note that the gate layers 315 herein correspond to the gate layers 115 in FIG. 1. The etch stop structures 323*a* and 323*b* respectively correspond to the etch stop structures 123*a* and 123*b*. The landing structures 320*a* and 320*b* respectively correspond to the landing structures 120*a* and 120*b*. The contact isolation layer 361 corresponds to the contact isolation layer 161.

As shown in FIG. 3G, the etch stop structures 323*a* and 323*b* are spaced apart from each other. For example, a first etch stop structure 323*a* has a horizontal offset D1' from the second stair step 310*b* while a second etch stop structure 323*b* has a horizontal offset D2' from the first stair step 310*a*. The etch stop structures 323*a* and 323*b* are spaced apart from each other a horizontal distance of D1'+D2'.

As mentioned previously, in some embodiments, the topside sacrificial layer 340 and the sacrificial gate layers 311 can include a same material, such as silicon nitride. In some examples, the remaining portions of the topside sacrificial layer 340 and the sacrificial gate layers 311 can be replaced in a same replacement process. Consequently, the etch stop structures (e.g. 323*a* and 323*b*) and the gate layers 315 can include a same conductive material, such as tungsten.

To perform the replacement process, in some examples, one or more gate line (GL) cut trenches (not shown) can be formed that extend through the initial memory stack of sacrificial gate layers 311 and insulating layers 313. Based on the GL cut trenches, the sacrificial gate layers 311 can be removed, and the gate layers 315 can be deposited to form the memory stack of gate layers 315 and insulating layers 313. Similarly, based on the GL cut trenches, the remaining portions of the topside sacrificial layer 340 can be replaced with material(s) for the gate layers 315 to form the etch stop structures.

Subsequently, contact holes (e.g. 337*a* and 337*b*) are formed that extend through the landing structures and expose top gate layers of the stair steps based on a 3-step contact hole etch process. Specifically, in FIG. 3H, a first step of the 3-step contact hole etch process is executed that stops at or within the etch stop structures 323*a* and 323*b* to form initial contact holes 337*a*' and 337*b*'. The first etching process is selective, meaning that the first etching process has a relatively high etching rate for the contact isolation layer 361 and a relatively low or zero etching rate for the etch stop structures 323*a* and 323*b*.

Figure 3I:
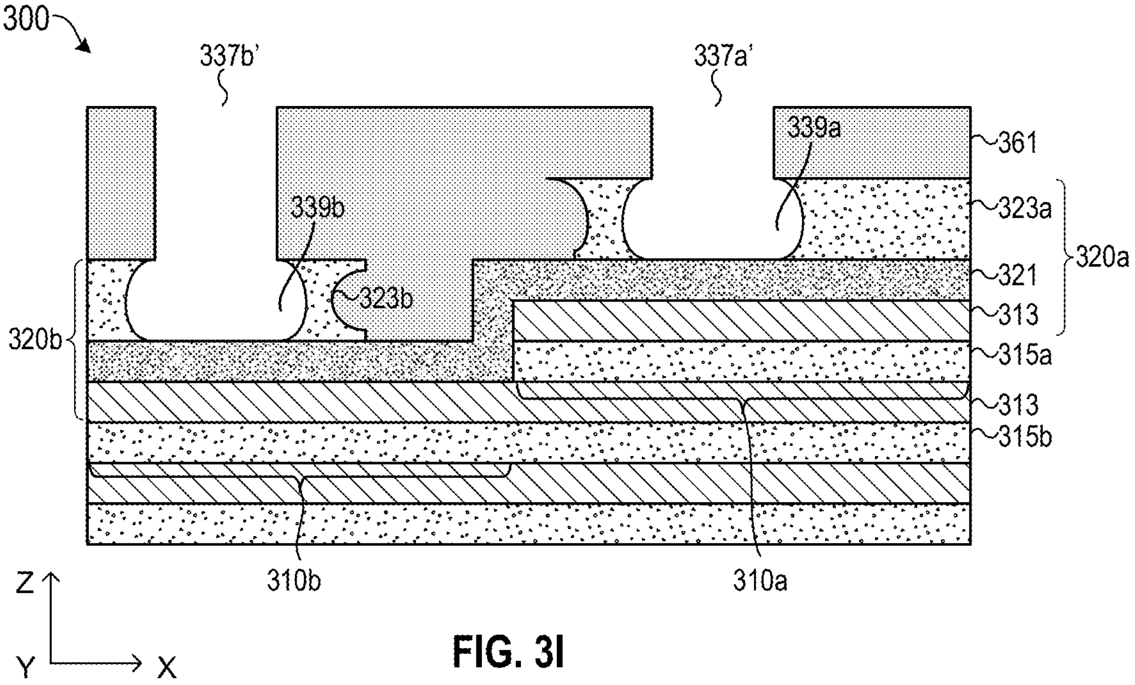
Figure 3J:
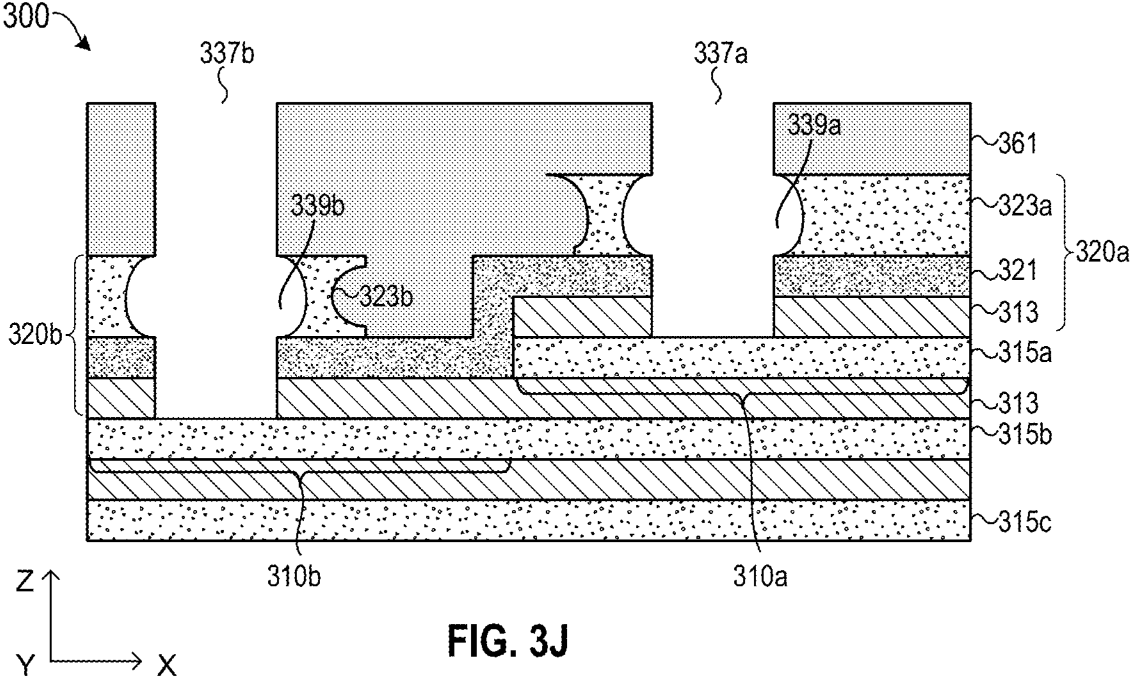

Then, a second step of the 3-step contact hole etch process is used to etch through the (remaining) landing structures 320*a* and 320*b*. As shown in FIG. 3I, the second step of the 3-step contact hole etch process is executed to etch through the etch stop structures 323*a* and 323*b*. In this example, the second step of the 3-step contact hole etch process is accomplished by wet etch, which isotopically etches the etch stop structures 323*a* and 323*b*, therefore forming undercuts 339*a* and 339*b*. The second step of the 3-step contact hole etch process is selective and stops at the stair step isolation layer 321. In FIG. 3J, a third step of the 3-step contact hole etch process is executed to directionally etch the stair step isolation layer 321 and the insulating layer 313 in order to expose the top gate layers (e.g. 315*a* and 315*b*). As a result, the contact holes 337*a* and 337*b* are formed. In another embodiment (not shown), the stair step isolation layer 321 is directly on the gate layers, such as first gate layer 315*a*, thus the third step of the 3-step contact hole etch process is executed to directionally etch the stair step isolation layer 321 to expose the gate layers (e.g. 315*a* and 315*b*).

It should be noted that additional steps can be provided before, during, and after processes described in FIGS. 3A-3J, and that some of the processes described can be replaced, eliminated, or performed in a different order for additional embodiments of the process. For example, contact structures, which respectively correspond to the contact structures 130*a* and 130*b* in FIG. 1, can be formed in the contact holes 337 and 337*b*. Additionally, the second and third etching processes described in FIGS. 3I-3J can be replaced with other etching processes, such as a single dry etch process.

In some embodiments, an etch stop layer, rather than the topside sacrificial layer 340, can be directly formed over the stair step isolation layer 321. The hard mask layer 350 may then be formed over the etch stop layer. Similarly, an opening, which corresponds to the opening 359, can be formed through the second slope 353 of the hard mask layer 350. A portion of the etch stop layer can be removed around the riser 371*a* of the first stair step 310*a* via the opening. As a result, remaining portions of the etch stop layer are separate from each other to form etch stop structures. The etch stop layer is configured to be etch-selective to the stair step isolation layer 321 and the contact isolation layer 361. Note that the etch stop layer is not formed in a replacement process and that the etch stop layer may or may not include a same material as the gate layers 315.

It is noted that the semiconductor device 100 can be suitably used in a memory system.

Figure 4:
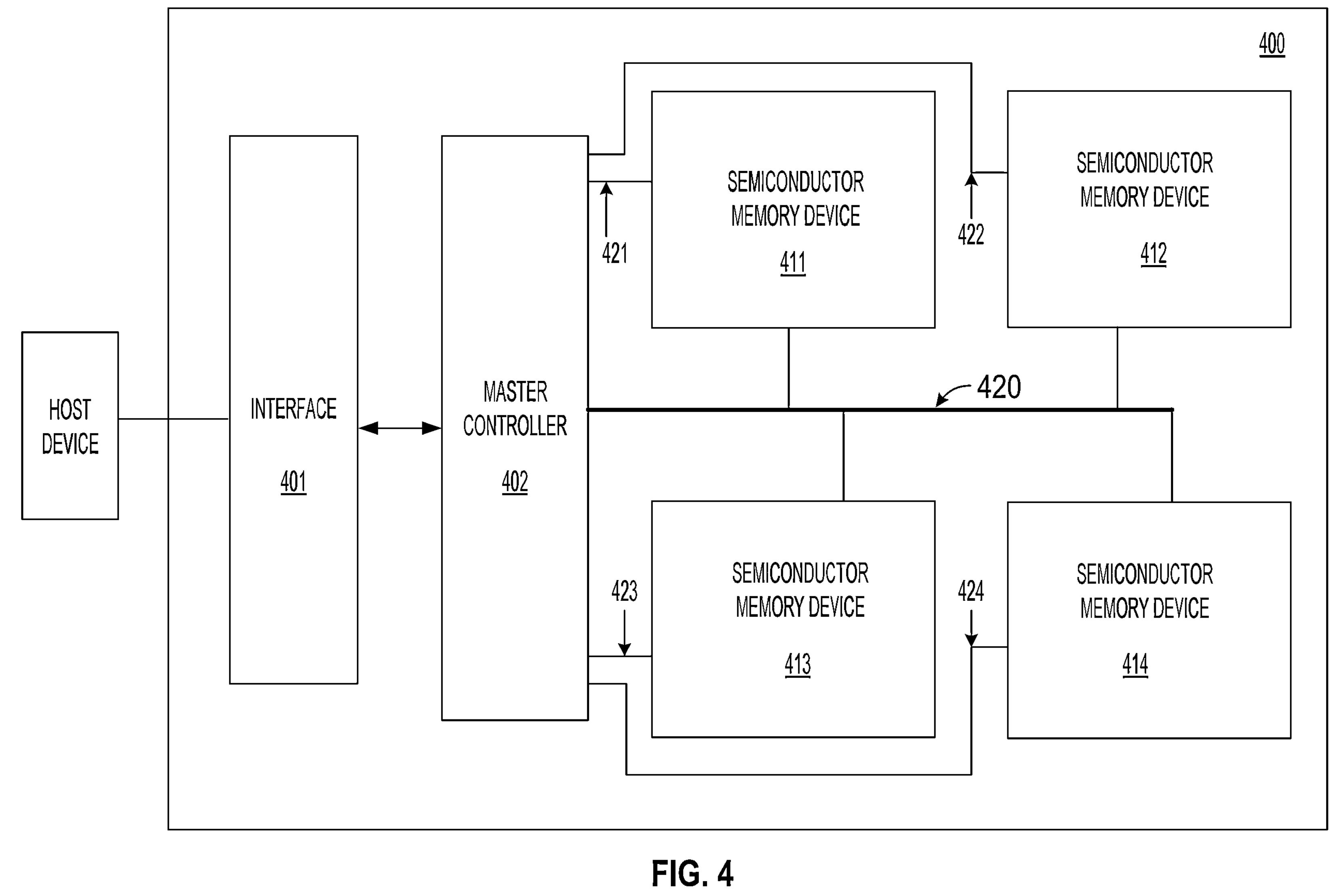
FIG. 4 shows a block diagram of a memory system device, in accordance with exemplary embodiments of the present disclosure.

FIG. 4 shows a block diagram of a memory system device 400, in accordance with exemplary embodiments of the present disclosure. The memory system device 400 includes one or more semiconductor memory devices, such as shown by semiconductor memory devices 411, 412, 413 and 414, which are respectively configured similarly to the semiconductor device 100. In some examples, the memory system device 400 is a solid state drive (SSD).

The memory system device 400 can include other suitable components. For example, the memory system device 400 includes an interface 401 and a master controller 402 coupled together as shown in FIG. 4. The memory system device 400 can include a bus 420 that couples the master controller 402 with the semiconductor memory devices 411-414. In addition, the master controller 402 is connected with the semiconductor memory devices 411-414 respectively, such as shown by respective control lines 421, 422, 423 and 424.

The interface 401 is suitably configured mechanically and electrically to connect between the memory system device 400 and a host device, and can be used to transfer data between the memory system device 400 and the host device.

The master controller 402 is configured to connect the respective semiconductor memory devices 411-414 to the interface 401 for data transfer. For example, the master controller 402 is configured to provide enable/disable signals respectively to the semiconductor memory devices 411-414 to activate/deactivate one or more semiconductor memory devices 411-414 for data transfer.

The master controller 402 is responsible for the completion of various instructions within the memory system device 400. For example, the master controller 402 can perform bad block management, error checking and correction, garbage collection, and the like.

In some embodiments, the master controller 402 is implemented using a processor chip. In some examples, the master controller 402 is implemented using multiple microcontroller units (MCUs).

"Device" or "semiconductor device" as used herein generically refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a memory stack of gate layers and insulating layers, the gate layers and the insulating layers being stacked alternatingly and forming stair steps in a staircase region;

a first landing structure disposed on a first gate layer of a first stair step of the stair steps in the staircase region, the first landing structure comprising a first upper structure and a first isolation stack between the first upper structure and the first gate layer, the first upper structure being etch-selective to a contact isolation layer that covers the staircase region; and a first contact structure extending through the contact isolation layer and the first landing structure and being connected with the first gate layer of the first stair step, wherein the first upper structure comprises a same conductive material as the first gate layer, and the first upper structure is shorter than the first isolation stack along a first direction parallel to the gate layers.

2. The semiconductor device of claim 1, further comprising:

a second landing structure disposed on a second gate layer of a second stair step of the stair steps in the staircase region, the second landing structure comprising a second upper structure of the conductive material and a second isolation stack between the second upper structure and the second gate layer; and a second contact structure extending through the contact isolation layer and the second landing structure and being connected with the second gate layer of the second stair step, the first upper structure and the second upper structure being isolated by the contact isolation layer.

3. The semiconductor device of claim 2, wherein:

the first isolation stack and the second isolation stack share a continuous stair step isolation layer that extends over the stair steps.

4. The semiconductor device of claim 3, wherein:

the continuous stair step isolation layer covers the stair steps in a conformal manner.

5. The semiconductor device of claim 3, wherein:

the continuous stair step isolation layer comprises a dielectric material that is etch-selective to silicon nitride.

6. The semiconductor device of claim 3, wherein:

the first isolation stack further comprises one of the insulating layers that is stacked on the first gate layer.

7. The semiconductor device of claim 1, wherein:

the first upper structure includes a recessed sidewall profile.

8. The semiconductor device of claim 1, wherein the first contact structure comprises:

a vertical portion; and a horizontal portion protruding into the first upper structure, wherein along the first direction parallel to the gate layers, the horizontal portion is longer than the vertical portion, and along a second direction perpendicular to the gate layers, the horizontal portion is spaced apart from and positioned between two opposing ends of the vertical portion.

9. The semiconductor device of claim 1, wherein:

the first upper structure comprises a first etch stop structure.

10. A memory system device, comprising:

a semiconductor memory device, comprising:

a memory stack of gate layers and insulating layers, the gate layers and the insulating layers being stacked alternatingly and forming stair steps in a staircase region;

a landing structure disposed on a first gate layer of a first stair step of the stair steps in the staircase region, the landing structure comprising an etch stop structure and an isolation stack between the etch stop structure and the first gate layer, the etch stop structure being etch-selective to a contact isolation layer that covers the staircase region;

a contact structure extending through the contact isolation layer and the landing structure and being connected with the first gate layer of the first stair step; and a channel structure extending through the memory stack of gate layers and insulating layers in an array region; and a control circuitry coupled with the semiconductor memory device to control data storage operations on the semiconductor memory device, wherein the etch stop structure comprises a same conductive material as the first gate layer, and the etch stop structure is shorter than the isolation stack along a direction parallel to the gate layers.

11. A method for fabricating a semiconductor device, the method comprising:

forming a memory stack of gate layers and insulating layers, the gate layers and the insulating layers being stacked alternatingly and forming stair steps in a staircase region;

forming a landing structure on a first gate layer of a first stair step of the stair steps in the staircase region, the landing structure comprising an upper structure that is an etch stop structure and an isolation stack between the upper structure and the first gate layer, the upper structure being etch-selective to a contact isolation layer that covers the staircase region, the upper structure comprising a same conductive material as the first gate layer, the upper structure being shorter than the isolation stack along a direction parallel to the gate layers; and forming a contact structure extending through the contact isolation layer and the landing structure, the contact structure being connected with the first gate layer of the first stair step.

12. The method of claim 11, wherein the forming the landing structure comprises forming the etch stop structure, which comprises:

replacing a sacrificial etch stop structure corresponding to the etch stop structure and sacrificial gate layers corresponding to the gate layers with the same conductive material in a same replacement process.

13. The method of claim 12, wherein the forming the etch stop structure further comprises:

depositing a continuous stair step isolation layer over the stair steps;

depositing a topside sacrificial layer over the continuous stair step isolation layer; and patterning the topside sacrificial layer into the sacrificial etch stop structure.

14. The method of claim 13, wherein the patterning the topside sacrificial layer further comprises:

removing transitional portions of the topside sacrificial layer above risers of the stair steps.

15. The method of claim 14, wherein the patterning the topside sacrificial layer further comprises:

depositing a hard mask layer, portions of the hard mask layer being disposed on the transitional portions of the topside sacrificial layer above the risers of the stair steps;

removing the portions of the hard mask layer on the transitional portions of the topside sacrificial layer; and removing the transitional portions of the top sacrificial layer.

16. The method of claim 15, wherein the removing the portions of the hard mask layer on the transitional portions of the topside sacrificial layer further comprises:

curing the hard mask layer so that the portions of the hard mask layer on the transitional portions of the topside sacrificial layer are less etch-resistant than other portions of the hard mask layer.

17. The method of claim 12, wherein the forming the memory stack comprises:

forming an initial memory stack of the sacrificial gate layers and the insulating layers, the sacrificial gate layers and the insulating layers being stacked alternatingly and forming the stair steps in the staircase region; and replacing the sacrificial gate layers with the gate layers to form the memory stack of the gate layers and the insulating layers.

18. The method of claim 11, wherein the forming the contact structure comprises:

etching an initial contact hole through the contact isolation layer with a stop based on the etch stop structure;

etching through the landing structure based on the initial contact hole to form a contact hole that exposes the first gate layer; and forming the contact structure in the contact hole.

* * * * *